United States Patent
Tunaboylu (10) Patent No.: US 7,180,315 B2
(45) Date of Patent: Feb. 20, 2007

(54) SUBSTRATE WITH PATTERNED CONDUCTIVE LAYER

(75) Inventor: Bahadir Tunaboylu, Gilbert, AZ (US)

(73) Assignee: SV Probe, Ltd., Singapore (SG)

( * ) Notice: Subject to any disclaimer, the term of this patent is extended or adjusted under 35 U.S.C. 154(b) by 0 days.

(21) Appl. No.: 11/166,431

(22) Filed: Jun. 24, 2005

(65) Prior Publication Data

US 2005/0287789 A1 Dec. 29, 2005

Related U.S. Application Data (60) Provisional application No. 60/583,391, filed on Jun. 28, 2004.

(51) Int. Cl.
*G01R 31/02* (2006.01)

(52) U.S. Cl. .................... 324/754; 324/158.1

(58) Field of Classification Search ............ None
See application file for complete search history.

(56) References Cited

U.S. PATENT DOCUMENTS

| | | | |
|---|---|---|---|
| 5,532,667 A | 7/1996 | Haertling et al. | 336/177 |
| 5,593,722 A | 1/1997 | Otani et al. | 427/101 |
| 5,601,673 A | 2/1997 | Alexander | 156/89 |
| 5,635,846 A | 6/1997 | Beaman et al. | 324/754 |
| 5,974,662 A * | 11/1999 | Eldridge et al. | 29/842 |
| 6,050,829 A | 4/2000 | Eldridge et al. | 439/67 |
| 6,160,412 A | 12/2000 | Martel et al. | 324/761 |
| 6,255,602 B1 | 7/2001 | Evans et al. | 174/262 |
| 6,420,887 B1 | 7/2002 | Kister et al. | 324/754 |
| 6,876,216 B2 * | 4/2005 | Fu-Chin | 324/758 |
| 6,878,901 B2 * | 4/2005 | Johnson et al. | 219/121.69 |
| 6,897,666 B2 * | 5/2005 | Swettlen et al. | 324/754 |
| 2001/0018797 A1 | 9/2001 | Shepherd | |
| 2003/0020173 A1 | 1/2003 | Huff et al. | |
| 2003/0234660 A1 | 12/2003 | Jain | |
| 2005/0225382 A1 * | 10/2005 | Miller | 327/551 |

FOREIGN PATENT DOCUMENTS

| | | |
|---|---|---|
| WO | WO 02/15260 A | 2/2002 |
| WO | WO 02/064301 A | 8/2002 |

OTHER PUBLICATIONS

C4 Probe Card Space Transformer Technology Overview, Chan, Leung, Southwest Test Workshop 2000, 24 pages, Jun. 2000.

* cited by examiner

*Primary Examiner*—Minh N. Tang
(74) *Attorney, Agent, or Firm*—Hickman Palermo Truong & Becker LLP; Christopher J. Brokaw (57) ABSTRACT

A method of processing a substrate is provided. The method includes providing a substrate having a first surface, a second surface, and conductive paths extending from the first surface to the second surface. The method also includes (1) covering a portion of the first surface with a conductive material, and (2) removing a portion of the conductive material to define conductive traces on the first surface.

33 Claims, 8 Drawing Sheets

SUBSTRATE WITH PATTERNED CONDUCTIVE LAYER

RELATED APPLICATION

This application is related to and claims priority from U.S. Provisional Application No. 60/583,391, filed Jun. 28, 2004, which is incorporated herein by reference in its entirety.

FIELD OF THE INVENTION

The present invention relates to substrates and, more particularly, to a space transformer including a patterned conductive layer.

BACKGROUND OF THE INVENTION

Probe cards are commonly used in the testing of integrated circuit devices, including memory chips. An exemplary probe card available from Kulicke and Soffa Industries Inc. of Gilbert, Ariz. has, on one side, an array of metal probes that are arranged to make contact with external electrical contacts, usually in the form of pads or bumps, on the chip being tested. The probes may be mounted, for example, within a probe head. Other probe cards have probes mounted directly to a substrate such as a space transformer. Probe cards also typically include has a printed circuit board (PCB) with traces that can be connected to a test circuit. The spacing of the traces on a PCB is typically substantially wider than the spacing of the pads on modern integrated circuits. In order to electrically connect the probes to the PCB traces, a probe card typically includes a space transformer. For example, in probe cards including a probe head, a space transformer (e.g., an MLO space transformer, an MLC space transformer, etc.) may be disposed between the probe head and the PCB. In probe cards where the probes are attached directly at one end to a substrate, the substrate may be the space transformer.

A space transformer is typically a generally planar structure. One side of the space transformer includes pads for contacting with the probes. The locations of the contact pads generally matches the positions of the tips of the probes. On its opposite face, the space transformer has contact pads to connect to the PCB (e.g., through a direct connection, through an interposer, etc). The contact pads for the PCB can be more widely spaced than the contact pads for the probes. For example, the PCB pads may have a pitch of 0.050" (1.25 mm). In order to connect the two sets of contact pads, one form of space transformer consists of a stack of ceramic layers with metallized through holes (conductive vias) that extend through the layers and metallized tracks or traces between the layers. The vias and tracks or traces provide conductive paths from the probe pads to respective PCB pads. By following a path through and between the layers, the conductive paths can spread out from the probe pad spacing to the PCB pad spacing.

One form of existing space transformer includes a multi-layer ceramic in which metallization is applied to the layers of ceramic prior to firing. The layers are then stacked and the combination is fired. However, ceramic materials tend to shrink and distort when they are fired. Even with low temperature co-fired ceramic (LTCC) materials, which are typically fired by sintering at temperatures below 1,000° C., the distortion can be appreciable, resulting in distortion of the probe pads. This has become an increasing problem as the sizes of integrated circuits have decreased.

Thus, it would be desirable to provide an improved space transformer overcoming one or more deficiencies of conventional space transformers.

SUMMARY OF THE INVENTION

According to an exemplary embodiment of the present invention, a method of processing a substrate is provided. The method includes providing a substrate having a first surface, a second surface, and conductive paths extending from the first surface to the second surface. The method also includes (1) covering a portion of the first surface with a conductive material, and (2) removing a portion of the conductive material to define conductive traces on the first surface.

According to another exemplary embodiment of the present invention, a method of processing a space transformer is provided. The method includes providing a multi-layer ceramic space transformer having a first surface, a second surface, and conductive paths extending from conductive vias adjacent the first surface to the second surface. The method also includes covering at least a portion of the first surface with a conductive material such that the conductive vias are covered by the conductive material. The method also includes determining locations on the conductive material spaced to contact probes of the probe card. The method also includes removing a portion of the conductive material to define conductive traces between (1) certain of the conductive vias and (2) certain of the locations on the conductive material.

According to yet another exemplary embodiment of the present invention, a space transformer configured as a component of a probe card is provided. The space transformer includes a first surface, a second surface, and conductive paths extending from the first surface to the second surface, the conductive paths including a plurality of conductive vias adjacent the first surface. The space transformer also includes conductive traces disposed on the first surface and on the conductive vias, the conductive traces being insulated from one another and providing electrical interconnection between (1) certain of the conductive vias and (2) probe pads configured to contact probes of the probe card.

The basic aspects of the present invention may be combined in a number of forms. The preferred aspects of the various constructions may be used in conjunction with one another or used alone. The various features provide certain advantages over the prior art. These advantages will be described herein and will be understood by those skilled in the art upon reviewing the description and drawings.

BRIEF DESCRIPTION OF THE DRAWINGS

For the purpose of illustrating the invention, there are shown in the drawings forms of the invention which are presently preferred; it being understood, however, that this invention is not limited to the precise arrangements and instrumentalities shown.

DETAILED DESCRIPTION OF THE DRAWINGS

Figure 1:
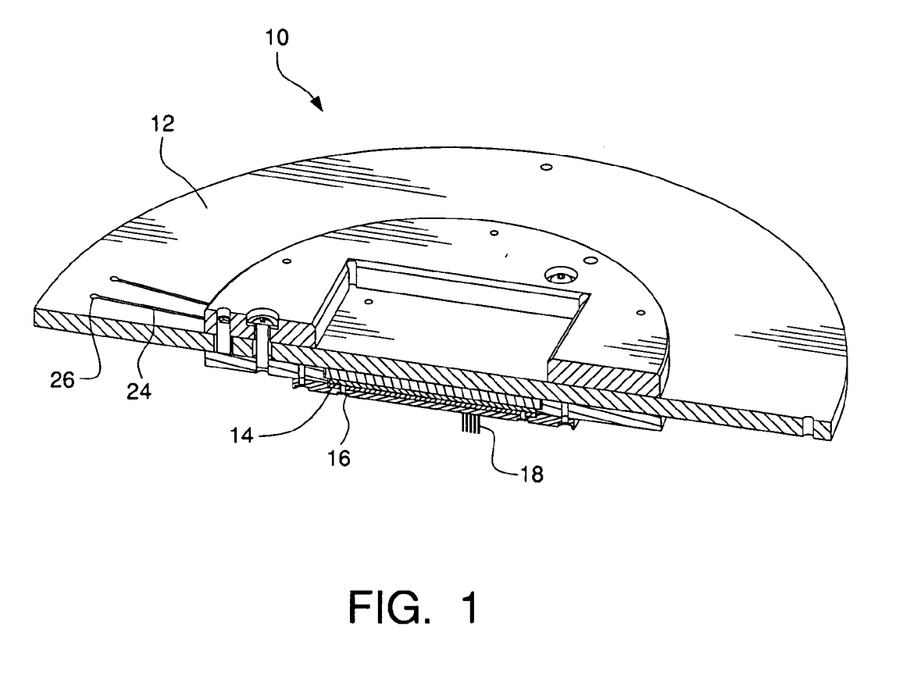
FIG. 1 is a schematic view of a probe card including a space transformer in accordance with an exemplary embodiment of the present invention.
Figure 2:
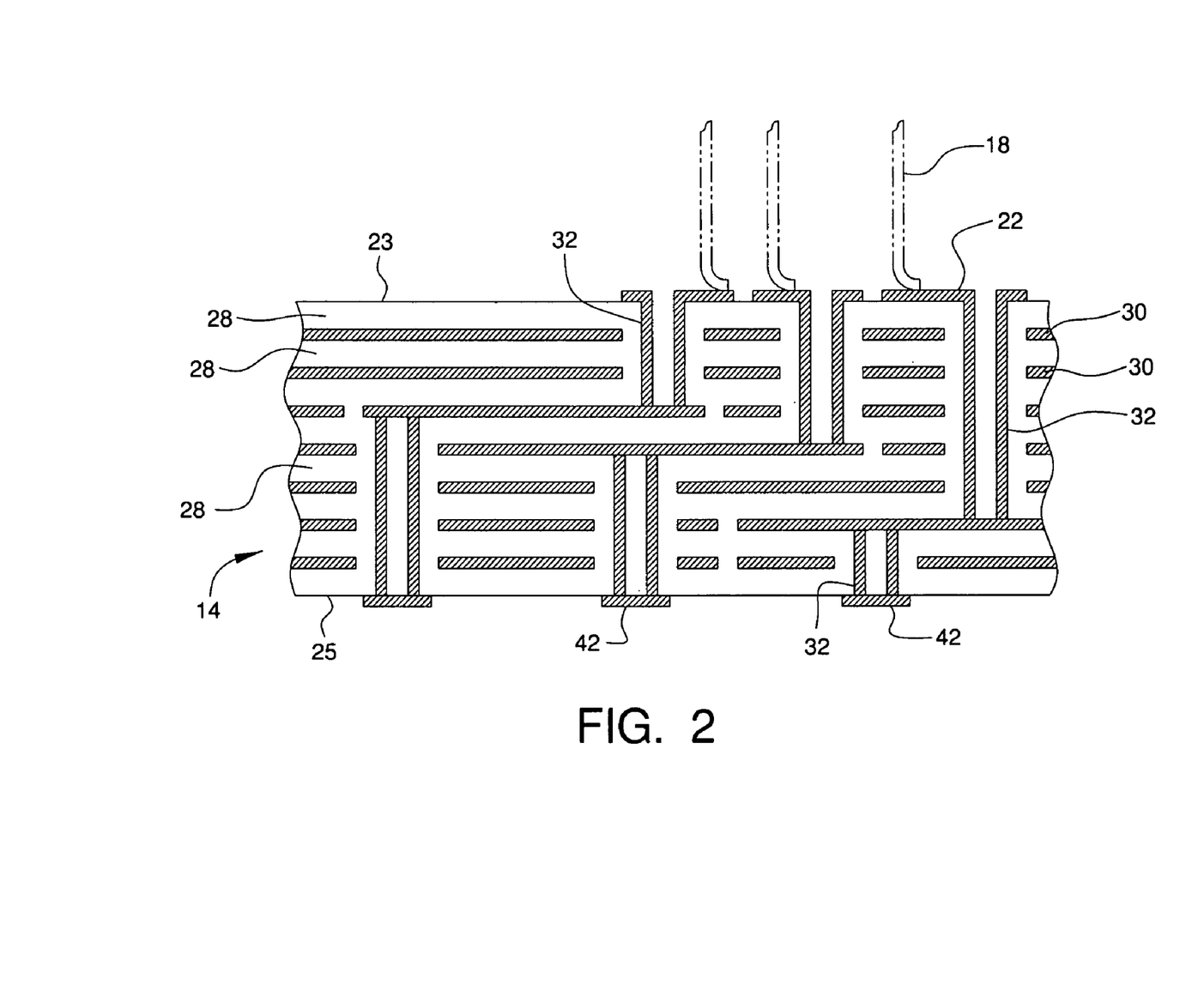
FIG. 2 is a schematic cross-sectional view of a space transformer in accordance with an exemplary embodiment of the present invention.

Referring to the drawings, wherein like reference numerals identify similar elements in the various figures, there is shown, initially in FIGS. 1 and 2, one embodiment of a probe card according to the present invention, indicated generally by the reference numeral 10. The probe card 10 comprises a printed circuit board (PCB) 12, a space transformer 14, and a probe head 16.

The probe head 16 comprises a large number of probe pins or probes 18 that, in use of the probe card 10, are intended to engage external pads, bumps, or other electrical contacts on an integrated circuit device (not shown) that is to be tested. As integrated circuit die designs become smaller and more complex, testing of the die (or multiple dies on a wafer) may require a few thousand probe pins 18 arrayed over several square inches. In probe cards including a probe head, the probe head also includes a carrier that holds the probe pins 18 correctly spaced and oriented so that they can engage the contacts on the device without touching each other. Such probe heads are commercially available, for example, as part of probe cards sold by Kulicke and Soffa Industries Inc. of Gilbert, Ariz.

The upper ends of the probe pins 18 are arranged so as to engage probe pads 22 (see FIG. 2) on the probe side 23 of the space transformer 14. The space transformer 14 is shown inverted in FIG. 2 (the probe head is not shown in FIG. 2). The probe pads 22, therefore, have a spacing and position that generally corresponds to the spacing and position of the probe pin upper ends configured to contact the integrated circuit device to be tested. The arrangement of the probe pads 22 need not be exactly identical to that of the contacts on the integrated circuit device to be tested since the probe pins are, in many cases, are non-linear in shape (e.g., having an arcuate portion).

The opposite side 25 (bottom face in FIG. 2) of the space transformer 14 has contacts 42 that are designed to electrically connect to contacts on the PCB 12. Preferably, the connection is by direct superposition, with or without an interposer. The position and spacing of the contacts on the PCB 12 typically corresponds to that of the contacts on the bottom face of the space transformer 14; however, the position and spacing may also vary between the contacts on the PCB 12 and the contacts on the bottom face of the space transformer 24. For simplicity, the bottom face 25 is referred to as the PCB side of the space transformer 14. Conductive traces 24 (see FIG. 1) on the PCB 12 join the contacts that connect to the space transformer 14 with contact pads 26 on the PCB that are sufficiently spaced to permit easy external testing.

In the embodiment shown in FIG. 2, the space transformer 14 includes a laminate of ceramic layers 28. Each layer 28 preferably includes conductive traces 30 that are formed on a surface of the ceramic layer. The multiple layers are stacked into the laminate with the traces being located between the layers. Vias 32 in the form of metal-plated through holes pass through one or more of the ceramic layers 28 to connect desired traces 30. In a simple arrangement, each via 32 emerging through the top layer of ceramic 28 (adjacent the probe side 23 of space transformer 14) is connected by a zigzag path of traces and vias to a via emerging through the bottom layer of ceramic 28 (i.e., the layer adjacent the opposite side 25 of space transformer 14), with each path being electrically separate from the remaining paths. Alternatively, it is contemplated that some paths may branch off, so that more than one top via and one bottom via are connected together. For example, it may be beneficial to connect a group of top vias to a single electrical connection, such as a power supply or ground. Capacitors and other components may be mounted on the bottom face of the space transformer 14 if desired.

In certain exemplary embodiments of the present invention, the space transformer is formed by creating the conductive traces 30 and the vias 32 on a green ceramic (i.e., non-fired). The conductive traces 30 may be applied, for example, by screen-printing. The ceramic layers 28 are assembled to form the space transformer 14, and the assembled space transformer is then heated to fire the ceramic. Preferably the ceramic material chosen is one that can be "low-temperature" fired through sintering at temperatures below 1,000° C. Suitable glass-ceramic materials include DuPont 951, DuPont 943, and Ferro A6M/S, which are fireable in air. Suitable materials for firing in an $N_2$ atmosphere include GL550, GL660, and GL771, obtainable from Kyocera Corporation, used with copper traces. These materials are available in the form of green tape, which can be used directly with each layer 28. HeraLock™, from Heraeus Inc. of New York, N.Y. is a new material that may be particularly suitable, because of its very low shrinkage in the X–Y plane of the tape.

Low-temperature firing makes it practical to use highly-conductive materials such as gold, silver, copper, gold/platinum alloy, or gold/palladium alloy, which can be fired in air, for the traces 30 and vias 32. On the top face 23 (i.e., the probe side 23 of space transformer 14), the vias 32 emerge through the top layer of ceramic 28. High temperature firing would typically utilize metals such as tungsten (wolfram) and molybdenum that have lower conductivity and are typically not fired in air. DuPont 951 ceramic with gold traces and vias is at present preferred since gold provides good conductivity, and since testing shows that gold and DuPont 951 bond securely together. A good bond is important, especially between the ceramic and the probe pads, since the bond is stressed by cyclical mechanical forces when the probes are brought into and out of contact with a die being tested.

Figure 3:
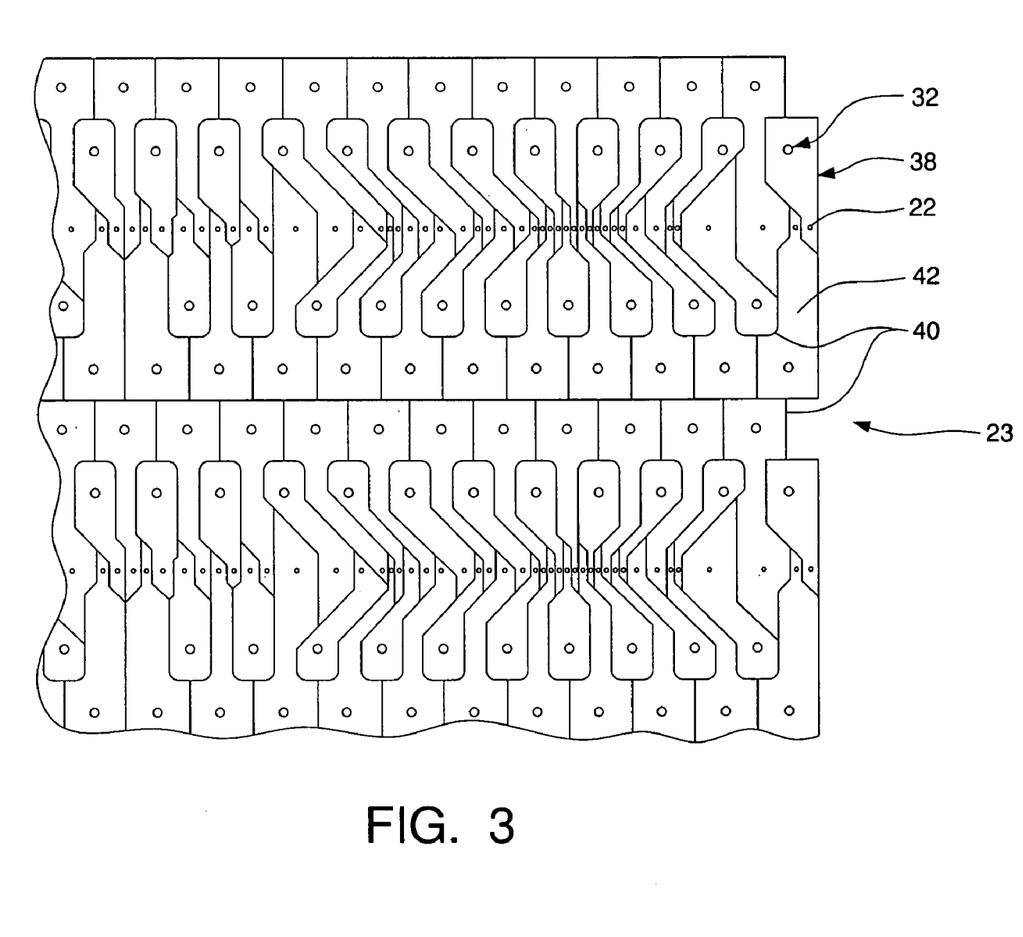
FIG. 3 is a plan view of part of the probe surface of a space transformer in accordance with an exemplary embodiment of the present invention.

Referring now specifically to FIG. 3 in which an enlarged portion of the probe side 23 of the space transformer is shown, a plurality of laser cut conductive traces 42 are shown. As will be discussed in more detail below, the laser cut conductive traces 42 are formed in a conductive layer 38, such as a thick film conductive layer 38. Each trace 42 electrically connects an associated probe pad 22 (i.e., a location on the conductive material where a probe will be mounted, or, in an embodiment utilizing a probe head, where the probe will contact during testing) with a corresponding via 32, thereby providing the electrical connectivity from the probe pad 22 to the via 32. As is clear to one of skill in the art, probe pad 22 is not necessarily a "pad" in structure as it is preferably a location on the conductive layer/material that will act as a contact point for the probe, where the location is conductively coupled to one or more conductive vias.

In order to form the laser cut conductive traces 40, one process involves machining the top surface of the space transformer 14 smooth after it is fired. It has been found that by a lapping and polishing process the surface of an exemplary LTCC space transformer 14 can be rendered smooth and planar to within 1 mil (25 μm) over an area 4 to 5 inches (100 to 125 mm) across. Glass-ceramic materials such as DuPont 951 may be easier to machine smooth than crystalline ceramic materials such as DuPont 943, Ferro A6M, or GL 771. The high rigidity of the ceramic materials (DuPont 951 ceramic has a Young's modulus of approximately 150 GPa.) combined with the high planarity allows for very even contact with the probe pins.

The smooth surface is then covered with a conductive material (e.g., by screen printing with a thick film conductive layer 38) to conductively connect all of the vias emerging through the top ceramic layer 28. In an exemplary embodiment, a thick film is utilized that is at least 10 μm thick. In a screen printed embodiment of the present invention, the conductive material may be any suitable material (e.g., Au, Ag, etc.) that can be screen printed onto, for example, a ceramic layer. In one preferred embodiment, the material is gold film. The screen printing process may be similar to processes already used for applying conductive traces in LTCC devices.

Alternatively, the thick film layer 38 may be screen-printed on the top ceramic layer 28 before firing. This could provide better bonding of the conductive layer 38 to the ceramic, but removes the opportunity to lap and polish the ceramic after firing.

The thick film conductive layer 38 is then cut through with a laser to form gaps 40 that divide the layer 38 into separate traces 42. With a ceramic substrate under the thick film layer 38, gaps 40 (e.g., gaps as narrow as 1 mil (25 μm)) can be cut without leakage. The traces in the present embodiment can also be as narrow as 25 μm, allowing probe pitches as fine as 50 μm. In one embodiment of the invention, a 355 nm wavelength UV laser was used to cut traces on the LTCC with gold films on the surface. For a gold film that had a thickness of 10–12 μm, two passes of the laser were utilized, which took less than 15 minutes to cut 2000 traces. If the thickness of the gold film is increased to 20 μm, then approximately 3 to 4 passes of the laser may be utilized. Additional passes may also be utilized to compensate for non-uniformities in the gold film. Various laser beam sizes can be used depending on the configuration. For example, tests were run using 11 μm and 25 μm, both with a typical 3 μm pulse width at 0.5 mJ average energy levels. The process can be varied and optimized for different conductor material such as silver or AgPd, as well as for different film thicknesses.

Since the traces may be formed on the ceramic substrate after firing, they are unaffected by shrinkage of the ceramic during firing, regardless of whether the conductive layer 38 is applied to the ceramic substrate before or after firing. In the embodiment shown in FIG. 3, each trace 42 connects to at least one via 32 and at least one probe pad 22. However, if the number of probe pads to be utilized is less than the number of top vias 32 available, some of the vias could be isolated by gaps 40, and not connected to corresponding probe pads.

As noted above, the firing of the ceramic for the space transformer 14 causes both shrinkage and distortion that cannot be exactly predicted and, therefore, limits the precision with which the top vias 32 can be positioned on the fired space transformer. For DuPont 951, the typical shrinkage in the X–Y plane is approximately 12.5%±0.4% in linear dimension. The average shrinkage can be compensated for by making the green space transformer oversized, but a variation in shrinkage is typically present in the fired product. As is shown in FIG. 3, the thick film conductive layer 38 is only cut after firing, and as such, any movement in the position of a via 32 can be accommodated by forming comparatively wide traces, thus providing substantial tolerance for variations in the location of the vias. In the present embodiment, the vias 32 may be spaced on, for example, a 5 mil (125 μm) pitch. In the example illustrated, the via pitch was 31 mils in one row (via diameter of 5 mils) and the probe pad pitch was 130 μm. In another example, the via pitch was 12.5 mils and probe pad pitch was 123 μm. With gaps 40 that are, for example, 1 mil (25 μm) wide, this allows the section of the traces 42 that connect with the vias 32 to be, for example, about 4 mil (100 μm) wide.

To ensure alignment of the pattern of traces 42 and to compensate for the overall shrinkage of the ceramic, one or more vias of the array (e.g., corner vias) are preferably formed in the space transformer and used as fiducial references for the laser cutting. The selected vias may be marked for future reference by cutting gaps 40 in distinctive shapes round or next to them. For example, they may be marked by cutting small, 5 mil diameter circles centered on them. Almost the whole width of the traces 42 is available as tolerance for the position of individual vias relative to the overall array. With traces of nominal width 4 mil, errors of up to ±64 μm (2.5 mil) in the positioning of the vias have been successfully accommodated using this system.

Conventional fiducials marks for MLC or LTCCs are 3 alignment marks in 3 corners of the array but away from the die. These marks are typically large, at least 10 mils in size or diameter. Such a marking system may not work well in connection with the present laser process. Three point alignment fiducials generally use scaling and, thus, can lead to misalignment on some areas of the array which is generally not acceptable. Using the laser viewing and positioning encoding systems, the present invention measures LTCC via placement at each corner to see if the substrate qualifies for the process based on via pitch on a particular device system. For example, two corner vias are then marked as fiducials and absolute coordinates are processed using those vias as reference points. Alignment marks that are large and well outside the array may cause additional error in position and may not be advisable.

Another alternative is a complete optical inspection of the via coordinates with subsequent programming to fit trace lines around each via by laser.

As discussed above, the probe pads 22 (locations for contact with the probes) may be defined by the laser cutting, and can therefore be positioned with a precision determined by the laser cutting process, which may be considerably more precise than the positioning of the vias 32 after the firing of the ceramic. As is shown in FIG. 3, there is typically considerable flexibility in the exact positioning of the gaps 40. Further, while the thick film 38 is of comparatively high conductance, its impedance is not wholly negligible. Consequently, the traces 42 may be shaped so as to match their impedances to a considerable extent.

Figure 6:
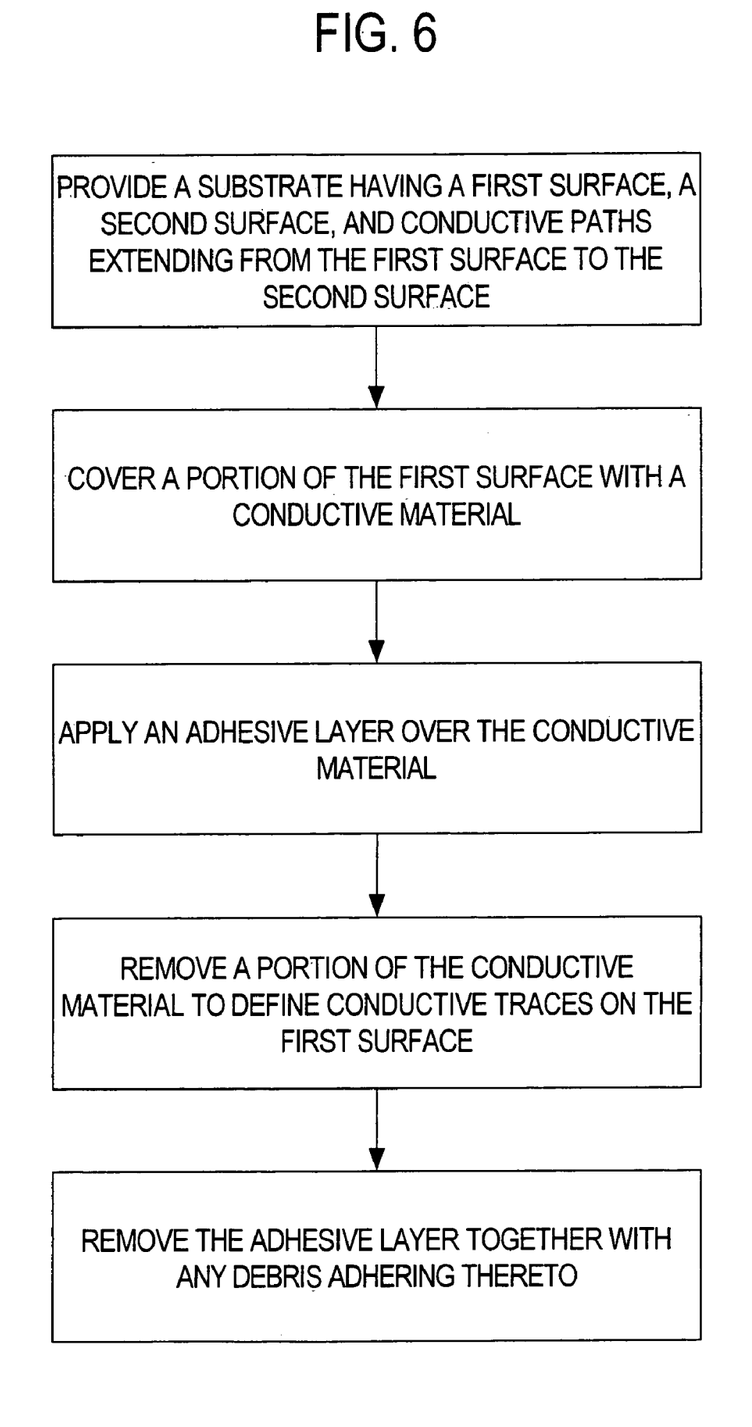
FIG. 6 is a flowchart of the functional steps of applying and removing an adhesive layer according to an embodiment of the invention.

FIG. 6 is a flowchart of the functional steps of applying and removing an adhesive layer according to an embodiment of the invention. To reduce contamination of the space transformer 14 by burnt debris from the laser cutting process, the thick film conductive layer 38 may be covered with a removable transparent or semitransparent tacky polymer film before the laser process. A NITTO tape is suitable and is available from Nitto Denko, Osaka, Japan. Specifically, a KC 100 blue tape with a 2.5 mil to 6 mil thickness can be used. Other tapes could also be used.

For example, the tape may be placed uniformly onto the thick film conductive layer (e.g., a Au film) to be trimmed. The side that is tacky mates to the Au film. The laser cuts traces in both the tape and the Au film underneath. The tape collects the debris from the cut. It also prevents debris generated during the cut from depositing back to Au surface, thus providing surface protection from debris. Once the cutting is complete, the tape is peeled off. Air or nitrogen may then be used to blow any remaining debris off the LTCC surface.

Alternatively, the conductive material (e.g., the thick film layer) may be lasered without using such a tacky film or tape, and then a cleaning process may employed (e.g., a chemical etching process such as acid etching, cyanide etching, etc.) to remove debris.

Figure 4:
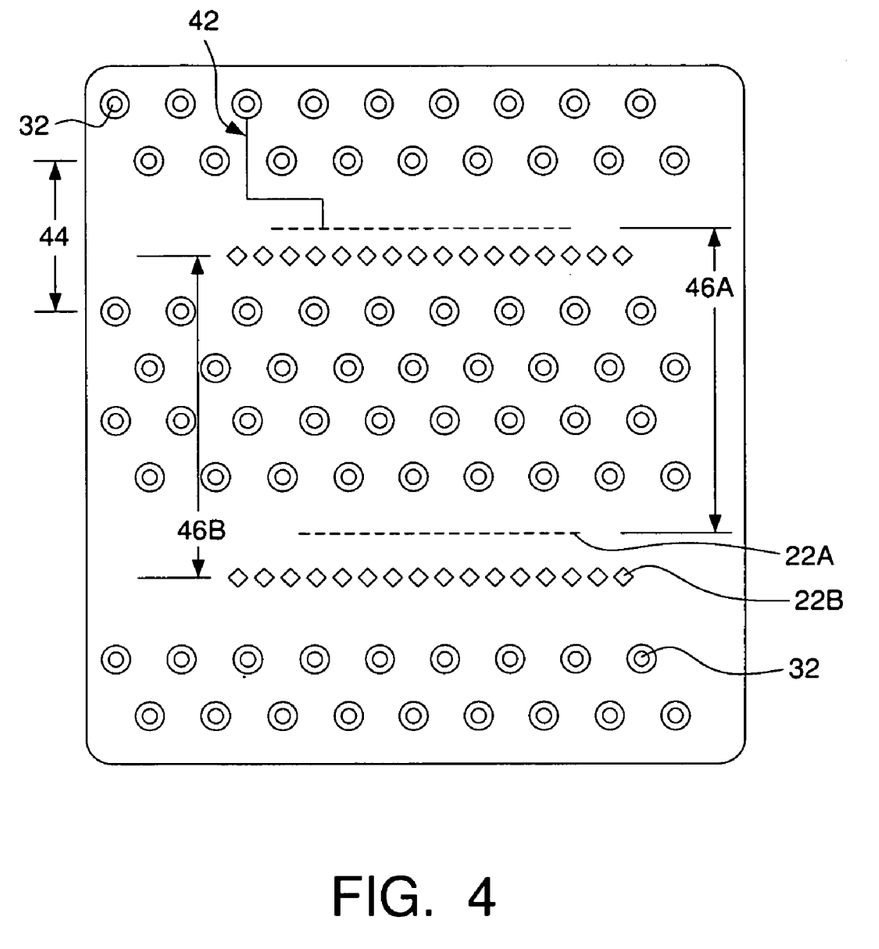
FIG. 4 is a diagram of part of the probe surface of a space transformer in accordance with an exemplary embodiment of the present invention.

Referring now to FIG. 4, the top vias 32 may be arranged in areas separated by spaces 44, within which the probe pads 22 are positioned. As shown in FIG. 4, the same spaces 44 may be used for rows of probe pads 22A and 22B in two different arrangements (in FIG. 4, a dashed line refers to a plurality of probe pads 22B). The rows of probe pads 22A and 22B may have different spacings 46A, 46B between rows, different spacings along rows, or both. Thus, by arranging suitable spacing 44 between groups of vias, it is possible to assemble and fire "generic" space transformers 14 that may, within limits, be used for any of a range of possible dies. For example, when a series of dies with related layouts are to be tested, such as a series of memory chips with different capacities, it may be possible to produce a single space transformer 14 design, with only the laser cutting of the gaps 40 and the actual probe head 16 (or the probes to be mounted to the space transformer) being different.

Such a "generic" substrate or space transformer may be particularly beneficial for a family of wafers. For example, certain semiconductor wafers (e.g., memory wafers), may be classified in a family based on the number of devices (e.g., DUTs) on a wafer. For example, wafers may be classified as 16 DUT, 32 DUT, 64 DUT, 128 DUT, 144 DUT, etc. Oftentimes, the contact pad row spacing for a wafer family may be very similar. Thus, a generic space transformer may be used for a family of DUTs, where the traces may be formed by laser for a desired probe location (probe pad location). The use of such a generic space transformer may save manufacturing time (e.g., an on shelf component), and cost.

If the pattern of traces 42 becomes damaged, or if the pattern of probe pads 22 is no longer useful, the space transformer 14 may be reused by machining off the traces 42 (or otherwise removing the traces) and reapplying the thick film coating 38. The new thick film coating 38 may then be cut with gaps 40 to form the same pattern of traces 42 as previously, or a different pattern.

For example, although an embodiment has been described that uses a screen-printed thick metal film of $\geq 10$ μm thickness for the top layer 38, a film (e.g., a thinner film) may be applied (e.g., by sputtering or plating) onto the top surface of the ceramic. The thin film may then be laser-trimmed as described above. It is also contemplated that photo-imageable ink may be used in the process. For example, Fodel® 5956 gold conductor photoprintable thick film material available from the DuPont Company, Research Triangle, NC or TC230IPI inks available from Heraeus Inc., Hanau, Germany, are suitable in the present invention.

Instead of forming a continuous conductive film and then laser-trimming the layer to form conductive traces, the conductive traces may be formed directly by laser-assisted deposition of conductive material (e.g., silver paste, gold paste, or alloys with platinum or palladium).

If a laser process of the present invention is used with organic substrates, the laser may undesirably cause significant damage to the substrate, and consequently to the edges of the traces. It has been found that this damage may result in leakage across 1 mil (25 μm) wide gaps. When forming the gaps with a laser process, it is therefore preferred, although not essential, to use a ceramic substrate. With alternative processes for forming the pattern of traces and gaps on the top surface, organic substrates may be more acceptable.

Although numerical values have been mentioned for various dimensions of the space transformer 14 and probe card 10, these are merely indicative of exemplary dimensions that are believed to be useful with integrated circuit technologies current at the time of writing and achievable with LTCC and laser technologies current at the time of writing. It is contemplated that these exemplary dimensions will change over time, and the present invention is not limited to any particular dimensions except in so far as an explicit limitation appears in an individual claim.

Figure 5A:
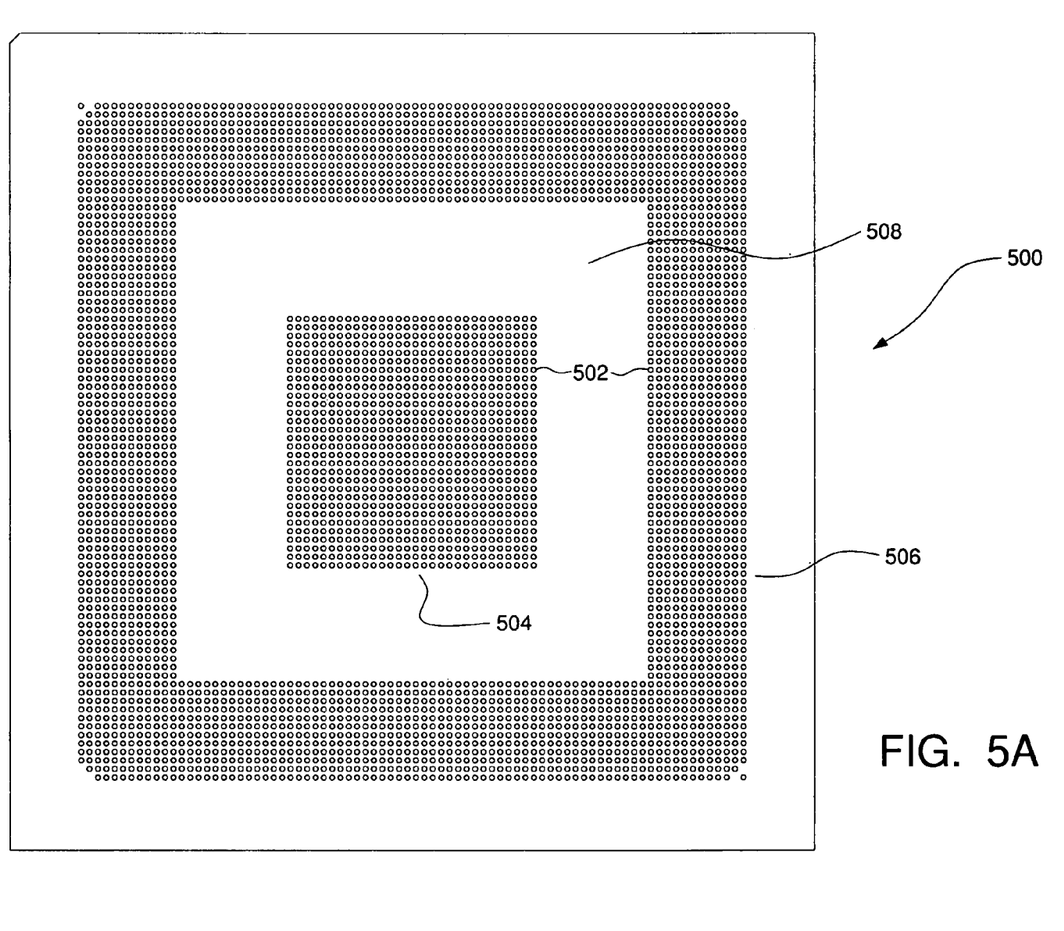
FIG. 5A is a bottom view of a substrate including contact pads in accordance with an exemplary embodiment of the present invention.
Figure 5B:
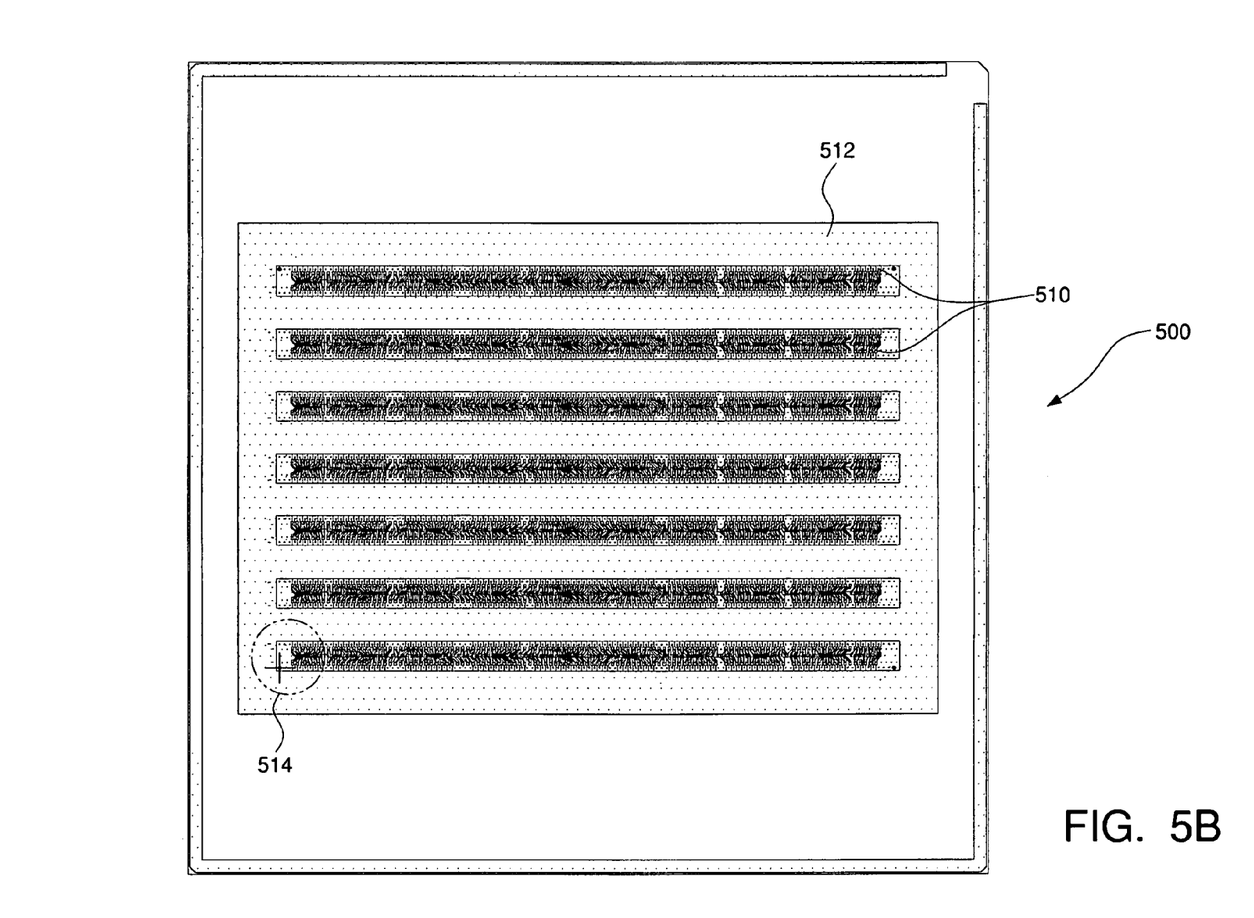
FIG. 5B is a top view of the substrate of FIG. 5A.

FIG. 5A is a bottom view of substrate 500 (e.g., a MLC space transformer). On the illustrated lower surface of substrate 500 are contact pads 502 (e.g., land grid array contact pads) which conductively extend through a conductive path from the lower surface illustrated in FIG. 5A to the upper surface of substrate 500 illustrated in FIG. 5B. In the exemplary substrate illustrated in FIG. 5A, contact pads 502 are arranged in a central location 504 and a peripheral location 506, with an area 508 of the lower surface of substrate 500 being void of any contact pads. For example, contact pads 500 may be arranged in such an orientation to provide a desired stress distribution, FIG. 5B is a top view of substrate 500. On the illustrated upper surface of substrate 500 are a plurality of rows of conductive vias 510. As can be appreciated from comparing FIG. 5A and FIG. 5B, the conductive paths are provided through substrate 500 from contact pads 502 (on the lower surface of substrate 500) to conductive vias 510 (on the upper surface of substrate 500). Conductive vias 510, and a portion of the upper surface of substrate 500, are covered with a conductive material 512 (e.g., a screen printed gold material).

Figure 5C:
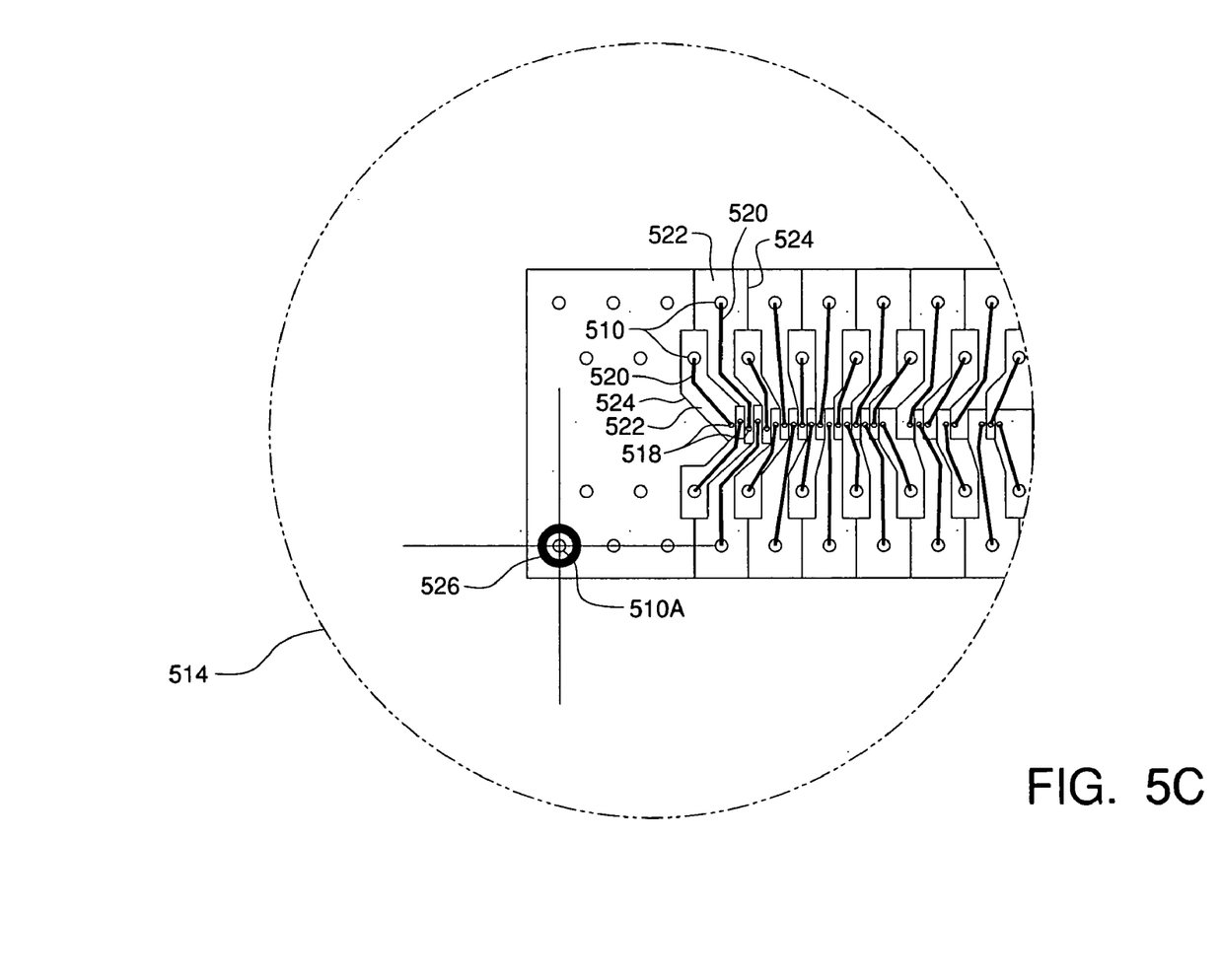
FIG. 5C is a detailed view of a portion of FIG. 5B.

FIG. 5C is a detailed view of section 514 of FIG. 5B. As shown in FIG. 5C, conductive vias 510 are conductively coupled to probe locations 518 along paths 520. Paths 520 are illustrative in nature, simply showing a conductive coupling between respective conductive vias 510 and probe locations 518. Such conductive paths 520 are provided by traces 522. As described above, traces 522 are provided by removing a portion of a conductive layer (e.g., a thick film of screen printed gold). The portion of the conductive layer removed is illustrated by gaps 524, which provide electrical isolation between adjacent traces 522 (thereby providing electrical isolation between adjacent conductive vias 510 and probe locations 518.

While probe locations 518 are illustrated in FIG. 5C with a circular shape, it is clear that the locations 518 are simply a location where a probe may ultimately be electrically coupled through a given trace 522 to a conductive via 510.

Also shown in FIG. 5C is conductive via 510A, positioned on an end of a row of conductive vias 510. In accordance with an exemplary embodiment of the present invention, one or more conductive vias 510A (preferably, but not necessarily positioned at an end of a row of conductive vias 510) may be used as a "fiducial" (i.e., a reference point) on the top surface of substrate 500. As shown in FIG. 5C, in order to provide a desired reference point, a portion of the conductive material (e.g., a thick film gold layer used to provide traces 522) around conductive via 510A is removed (e.g., via a laser) to define blank area 526. As will be understood by those of ordinary skill in the art, by providing blank area 526 (with no conductive material) around conductive via 510A, an improved fiducial is provided.

As is appreciated by those of skill in the art, it is not necessary that each conductive via 510 be conductively coupled through a trace 522 to a single probe location 518. Rather, groups of conductive vias and/or probe locations may be conductively coupled as desired using traces 522. For example, it may be desirable to group power signals or ground signals.

Although the present invention has been described primarily with respect to a space transformer, and more specifically a MLC space transformer, it is not limited thereto. The teachings disclosed herein may be employed in connection with any of a number of substrates (e.g., MLCs, MLOs, PCBs) regardless of space transformation. Further, the teachings disclosed herein may be employed in single layer substrates, as opposed to multi-layer substrates such as MLCs and MLOs.

Although the present invention has been described primarily with respect to space transformers used in a connection with probe cards, it is not limited thereto. The techniques presented herein may be applied to other technologies such as package testing of semiconductor devices where a space transformer is utilized.

The invention herein has been described and illustrated with respect to certain exemplary embodiments. It should be understood by those skilled in the art that the foregoing and various other changes, omissions and additions may be made therein and thereto, without departing from the spirit and scope of the present invention.

The invention claimed is:

1. A method for processing a substrate, compnsing:
    firing a multi-layer substrate, wherein the multi-layer substrate has a first surface, a second surface that opposes the first surface, and conductive paths extending from the first surface to the second surface;
    after firing the multi-layer substrate, smoothing the first surface of the multi-layer substrate;
    after smoothing the first surface, covering a portion of the first surface with a conductive material; and
    removing a portion of the conductive material from the first surface to define conductive traces on the first surface.

2. The method of claim 1, wherein the multi-layer substrate is a space transformer substrate.

3. The method of claim 2, wherein removing the portion of the conductive material is performed using laser trimming.

4. The method of claim 2, wherein covering the portion of the first surface includes covering the portion of the first surface with the conductive material in a layer at least 1.0 μm thick.

5. The method of claim 1, further comprising:
    applying an adhesive layer over the conductive material before removing the portion of the conductive material and
    removing the adhesive layer, together with any debris adhering thereto, after removing the portion of the conductive material.

6. The method of claim 1, wherein the multi-layer substrate is a a space transformer substrate, and removing the portion of the conductive material includes removing the portion of the conductive material to define the conductive traces between (1) conductive vias of the space transformer substrate and (2) respective predetermined locations of the conductive material configured to be probe pads.

7. The method of claim 6, further comprising:
    selecting a plurality of the conductive vias as fiducials; and
    determining positions, by reference to the fiducials, for at least one of: the probe pads and the conductive traces.

8. The method of claim 1, wherein the multi-layer substrate is a multi-layer ceramic substrate.

9. The method of claim 1, further comprising:
    predetermining at least one of a width and shape of the conductive traces such that an impedance of the conductive traces is substantially matched prior to removing the portion of the conductive material.

10. The method of claim 1, wherein the portion of the conductive material is a first portion, and the method further comprises:
    taking a remaining portion of the conductive material away from the first surface after removing the first portion of the conductive material:
    covering a portion of the first surface with additional conductive material after taking the remaining portion of the conductive material away; and
    removing a portion of the additional conductive material to define new conductive traces on the first surface.

11. A method for processing a space transformer comprising:
    firing a multi-layer ceramic space transformer of a probe card, wherein the multi-layer ceramic space transformer has a first surface, a second surface that opposes the first surface, and conductive paths, formed by conductive vias, that extend from the first surface to the second surface;
    after firing the multi-layer ceramic space transformer, smoothing the first surface of the multi-layer ceramic space transformer;
    after smoothing the first surface, covering at least a portion of the surface with a conductive material such that the conductive vias are covered by the conductive material;
    determining locations, on the conductive materials spaced to contact probes of the probe card; and
    removing a portion of the conductive material to define conductive traces between the conductive vias and the locations, on the conductive material, spaced to contact probes of the probe card.

12. The method of claim 11 wherein removing the portion of the conductive material comprises laser trimming.

13. The method of claim 11 wherein covering at least the portion of the first surface of the multi-layer ceramic space transformer with the conductive material includes covering the portion of the first surface with the conductive material in a layer at least 10 μm thick.

14. The method of claim 11, further comprising:
    applying an adhesive layer over the conductive material before removing the portion of the conductive material to define conductive traces; and removing the adhesive layer, together with any debris adhering thereto, after removing the portion of the conductive material to define conductive traces.

15. The method of claim 11, further comprising:
selecting a plurality of the conductive vias as fiducials; and
determining positions, by reference to the fiducials, for at least one of (1) the locations, on the conductive material, spaced to contact probes of the probe card and (2) the conductive traces.

16. The method of claim 11, further comprising:
predetermining at least one of a width and shape of the conductive traces such that an impedance of the conductive traces is substantially matched prior to removing the portion of the conductive material to define conductive traces.

17. The method of claim 11, wherein the portion of the conductive material is a first portion, and the method further comprises:
taking a remaining portion of the conductive material away from the first surface after removing the first portion of the conductive material to define conductive traces;
covering, after taking the remaining portion of the conductive material away, a portion of the first surface with additional conductive material such that the conductive vias are covered by the additional conductive material; and
removing a portion of the additional conductive material to define new conductive traces between (a) the conductive vias and (b) predetermined locations on the additional conductive material.

18. A method for processing a substrate, comprising:
covering a portion of a first surface of a multi-layer substrate with a conductive material, wherein the multi-layer substrate has the first surface, a second surface that opposes the first surface, and conductive paths extending from the first surface to the second surface,
applying an adhesive layer over the conductive material;
after the adhesive layer has been applied to the conductive material, removing a portion of the conductive material to define conductive traces on the first surface; and
removing the adhesive layer, together with any debris adhering thereto, after removing the portion of the conductive material to define conductive traces on the first surface.

19. The method of claim 18, wherein the multi-layer substrate is a space transformer substrate.

20. The method of claim 18, wherein removing the portion of the conductive material to define conductive traces is performed using laser trimming.

21. The method of claim 18, wherein covering the portion of the first surface of the multi-layer substrate with the conductive material includes covering the portion of the first surface with the conductive material in a layer at least 10 μm thick.

22. The method of claim 18, wherein the multi-layer substrate is a space transformer substrate, and wherein removing the adhesive layer includes removing the portion of the conductive material to define the conductive traces between (1) conductive vias of the space transformer substrate and (2) respective predetermined locations of the conductive material configured to be probe pads.

23. The method of claim 22, further comprising:
selecting a plurality of the conductive vias as fiducials; and
determining positions, by reference to the fiducials, for at least one of the probe pads and the conductive traces.

24. The method of claim 18, wherein the multi-layer substrate is a multi-layer ceramic substrate.

25. The method of claim 18, wherein the multi-layer substrate is a multi-layer ceramic substrate, and wherein the method further comprises:
prior to covering the portion of the first surface of the multi-layer ceramic substrate with a conductive material, but after firing the multi-layer ceramic substrate, smoothing the first surface of the multi-layer ceramic substrate.

26. The method of claim 18, further comprising:
predetermining at least one of a width and shape of the conductive traces such that an impedance of the conductive traces is substantially matched prior to removing the adhesive layer.

27. The method of claim 18, wherein the portion of the conductive material is a first portion, and the method further comprises:
taking a remaining portion of the conductive material away from the first surface after removing the first portion of the conductive material to define conductive traces on the first surface;
covering a portion of the first surface with additional conductive material after taking the remaining portion of the conductive material away from the first substrate; and
removing a portion of the additional conductive material to define new conductive traces on the first surface.

28. A method for processing a space transformer, comprising:
covering at least a portion of a first surface of a multi-layer ceramic space transformer with a conductive material such that conductive vias are covered by the conductive material, wherein the multi-layer ceramic space transformer has a first surface, a second surface that opposes the first surface, and conductive paths extending from the conductive vias adjacent the first surface to the second surface;
determining locations, on the conductive material, spaced to contact probes of the probe card;
applying an adhesive layer over a portion of the conductive material that covers the first surface;
removing a portion of the conductive material to define conductive traces between the conductive vias and the locations, on the conductive material, spaced to contact probes of the probe card;
after all conductive traces have been defined on the conductive material, removing the adhesive layer and any debris adhering thereto.

29. The method of claim 28, wherein removing the portion of the conductive material to define conductive traces is performed using laser trimming.

30. The method of claim 28, wherein covering at least a portion of the first surface of the multi-layer ceramic space transformer with the conductive material includes covering the portion of the first surface with the conductive material in a layer at least 10 μm thick.

31. The method of claim 28, further comprising:
selecting a plurality of the conductive vias as fiducials; and
determining positions, by reference to the fiducials, for at least one of (1) the locations, on the conductive material, spaced to contact probes of the probe card and (2) the conductive traces.

32. The method of claim 28, further comprising:
predetermining at least one of a width and shape of the conductive traces such that an impedance of the conductive traces is substantially matched prior to removing the portion of the conductive material.

33. The method of claim 28, wherein the portion of the conductive material is a first portion, and the method further comprises:
taking a remaining portion of the conductive material away from the first surface after removing the first portion of the conductive material;
after taking the remaining portion of the conductive material away from the first surface, covering a portion of the first surface with additional conductive material such that the conductive vias are covered by the additional conductive material; and
removing a portion of the additional conductive material to define new conductive traces between the conductive vias and predetermined locations on the additional conductive material.

* * * * *